(12) United States Patent
Ogawa et al.

(10) Patent No.: US 10,784,394 B2
(45) Date of Patent: Sep. 22, 2020

(54) ELECTROMAGNETIC WAVE DETECTOR AND ELECTROMAGNETIC WAVE DETECTOR ARRAY

(71) Applicant: Mitsubishi Electric Corporation, Chiyoda-ku (JP)

(72) Inventors: Shimpei Ogawa, Chiyoda-ku (JP); Daisuke Fujisawa, Chiyoda-ku (JP); Masaaki Shimatani, Chiyoda-ku (JP); Satoshi Okuda, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/305,465

(22) PCT Filed: Apr. 20, 2017

(86) PCT No.: PCT/JP2017/015832
§ 371 (c)(1),
(2) Date: Nov. 29, 2018

(87) PCT Pub. No.: WO2018/012076
PCT Pub. Date: Jan. 18, 2018

(65) Prior Publication Data
US 2020/0052146 A1    Feb. 13, 2020

(30) Foreign Application Priority Data

Jul. 12, 2016 (JP) .................. 2016-137676

(51) Int. Cl.
*H01L 31/113* (2006.01)
*H01L 27/14* (2006.01)
*G01J 1/42* (2006.01)
*H01L 27/144* (2006.01)
*H01L 31/0224* (2006.01)
*H01L 31/028* (2006.01)

(52) U.S. Cl.
CPC ............ *H01L 31/1136* (2013.01); *G01J 1/42* (2013.01); *H01L 27/1443* (2013.01);
(Continued)

(58) Field of Classification Search
CPC ............... H01L 31/1136; H01L 31/028; H01L 31/022408; H01L 27/14; H01L 31/11; H01L 31/113
See application file for complete search history.

(56) References Cited

U.S. PATENT DOCUMENTS

2011/0042650 A1 * 2/2011 Avouris .............. H01L 29/1606
257/29
2011/0068320 A1 3/2011 Marinero et al.
(Continued)

FOREIGN PATENT DOCUMENTS

JP 2011-66427 A 3/2011
JP 2013-502735 A 1/2013
(Continued)

OTHER PUBLICATIONS

International Search Report dated Jul. 18, 2017 in PCT/JP2017/015832 filed Apr. 20, 2017.
(Continued)

*Primary Examiner* — Fazli Erdem
(74) *Attorney, Agent, or Firm* — Xsensus LLP

(57) ABSTRACT

An electromagnetic wave detector, which photoelectrically converts and detects an electromagnetic wave incident on a graphene layer, including: a substrate having a front surface and a back surface; a lower insulating layer provided on the front surface of the substrate; a ferroelectric layer and a pair of electrodes provided on the lower insulating layer, the pair of electrodes arranged to face each other with the ferroelectric layer sandwiched therebetween; an upper insulating layer provided on the ferroelectric layer; and a graphene layer arranged on the lower insulating layer and the upper insulating layer to connect the two electrodes. Alternatively, the electromagnetic wave detector includes: a graphene layer provided on the lower insulating layer; and a ferroelectric layer provided on the graphene layer with an upper
(Continued)

insulating layer interposed therebetween and a pair of electrodes provided on the graphene layer to face each other with the ferroelectric layer sandwiched therebetween.

17 Claims, 9 Drawing Sheets

(52) U.S. Cl.
CPC ........ *H01L 27/1446* (2013.01); *H01L 31/028* (2013.01); *H01L 31/022408* (2013.01)

(56) References Cited

U.S. PATENT DOCUMENTS

| | | | |
|---|---|---|---|
| 2011/0170330 A1* | 7/2011 | Oezyilmaz | .......... H01L 29/1606 365/145 |
| 2012/0305891 A1 | 12/2012 | Nayfeh et al. | |
| 2014/0319357 A1* | 10/2014 | Ogawa | .................. G01J 5/0881 250/349 |
| 2015/0333196 A1* | 11/2015 | Shin | .................. H01L 31/02240 257/29 |
| 2017/0301385 A1* | 10/2017 | Liu | ......................... G11C 11/22 |

FOREIGN PATENT DOCUMENTS

| | | |
|---|---|---|
| JP | 2015-31666 A | 2/2015 |
| WO | WO 2011/023603 A2 | 3/2011 |

OTHER PUBLICATIONS

Tsuchiya, H. et al, "Simulation of Electron Transport in Atomic Monolayer Semiconductor FETs", Journal of Advanced Simulation in Science and Engineering, vol. 2, No. 1, 2015, pp. 127-152.

* cited by examiner

ELECTROMAGNETIC WAVE DETECTOR AND ELECTROMAGNETIC WAVE DETECTOR ARRAY

TECHNICAL FIELD

The present invention relates to an electromagnetic wave detector and, more particularly, to an electromagnetic wave detector using graphene as a photodetection layer.

BACKGROUND ART

In a conventional electromagnetic wave detector, a semiconductor material is generally used as an electromagnetic wave detection layer; however, the semiconductor material has a predetermined band gap and therefore causes a problem that only an electromagnetic wave having energy larger than the band gap can be detected.

Therefore, graphene having a band gap of zero or an extremely small band gap is attracting attention as a material of the electromagnetic wave detection layer used for a next generation electromagnetic wave detector, and, for example, a proposed electromagnetic wave detector has a gate oxide film formed on a substrate with a channel layer of graphene deposited thereon and a source and a drain formed at both ends of the channel layer (see, e.g., Patent Document 1).

PRIOR ART DOCUMENT

Patent Document

Patent Document 1: Japanese Laid-Open Patent Publication No. 2013-502735

SUMMARY OF THE INVENTION

Problem to be Solved by the Invention

However, if an electromagnetic wave detection layer of an electromagnetic wave detector is made of graphene alone, graphene has a very low electromagnetic wave absorptivity of several percent, and therefore has a problem of reduced detection sensitivity although a wavelength range of detectable electromagnetic waves is expanded.

It is therefore an object of the present invention to provide an electromagnetic wave detector capable of detecting electromagnetic waves in a wide wavelength range with high sensitivity.

Means for Solving Problem

The present invention provides
an electromagnetic wave detector comprising:
a substrate having a front surface and a back surface;
a lower insulating layer disposed on the front surface of the substrate;
a ferroelectric layer, and a pair of electrodes oppositely arranged with the ferroelectric layer interposed therebetween, disposed on the lower insulating layer;
an upper insulating layer disposed on the ferroelectric layer; and
a graphene layer disposed on the lower insulating layer and the upper insulating layer to connect the two electrodes,
the graphene layer having a surface serving as an electromagnetic wave incident surface on the side opposite to the lower insulating layer,
the electromagnetic wave detector photoelectrically converting and detecting an electromagnetic wave incident on the graphene layer, wherein
the ferroelectric layer is changed in polarization value by an electromagnetic wave so that a voltage is applied to the graphene layer.

The present invention also provides
an electromagnetic wave detector comprising:
a substrate having a front surface and a back surface;
a lower insulating layer disposed on the front surface of the substrate;
a graphene layer disposed on the lower insulating layer; and
a ferroelectric layer disposed via an upper insulating layer above the graphene layer and a pair of electrodes oppositely arranged with the ferroelectric layer interposed therebetween,
the graphene layer having a surface serving as an electromagnetic wave incident surface on the side opposite to the lower insulating layer,
the electromagnetic wave detector photoelectrically converting and detecting an electromagnetic wave incident on the graphene layer, wherein
the ferroelectric layer is changed in polarization value by an electromagnetic wave so that a voltage is applied to the graphene layer.

Effect of the Invention

In the present invention, the polarization value changes on a surface of the ferroelectric layer due to the pyroelectric effect of the incident electromagnetic wave, and a voltage is applied due to the change (hereinafter, this is referred to as "polarization voltage"). As a result, a current flows through the graphene layer due to the polarization voltage applied to the graphene layer in addition to a photocurrent generated in the graphene layer due to the incidence of the electromagnetic wave, so that the electromagnetic wave can be detected with high sensitivity.

Additionally, in the present invention, a pseudo PNP junction is formed in the graphene layer by disposing the ferroelectric layer, and the photocurrent extraction efficiency is further improved by this potential gradient (electron density gradient).

MODES FOR CARRYING OUT THE INVENTION

In embodiments of the present invention; an electromagnetic wave detector will be described by using visible light or infrared light; however, the present invention is effective not only to these lights but also to detectors of radio regions such as X-rays, ultraviolet light, near infrared light, terahertz (THz) waves, and microwaves, for example. In the embodiment of the present invention, these lights and radio waves are collectively referred to as electromagnetic waves.

In the embodiments of the present invention, the electromagnetic wave detector will be described by using a structure having two electrodes of a source and a drain, and a structure further including a back electrode serving as a back gate; however, the present invention is also applicable to electromagnetic wave detectors having other electrode structures such as a four-terminal electrode structure and a top gate structure.

Regarding a surface plasmon resonance phenomenon that is interaction between a metal surface and light, a plasmon resonance phenomenon, a phenomenon called pseudo surface plasmon resonance in the sense of resonance on a metal surface in other than the visible light region/near infrared light region, or a phenomena called metamaterial or plasmonic metamaterial in the sense of operating a specific wavelength with a structure having a dimension less than or equal to a wavelength, these phenomena are not particularly distinguished by names and are considered as equivalent phenomena from the viewpoint of the effect produced by the phenomena. These resonances are herein referred to as surface plasmon resonance, plasmon resonance, or simply resonance.

First Embodiment

Figure 1:
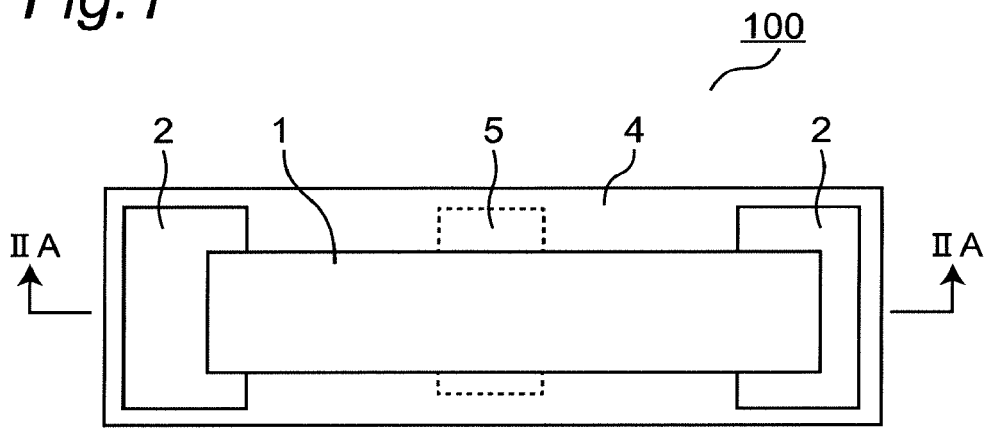
FIG. 1 is a top view of an electromagnetic wave detector according to a first embodiment of the present invention.
Figure 2A:
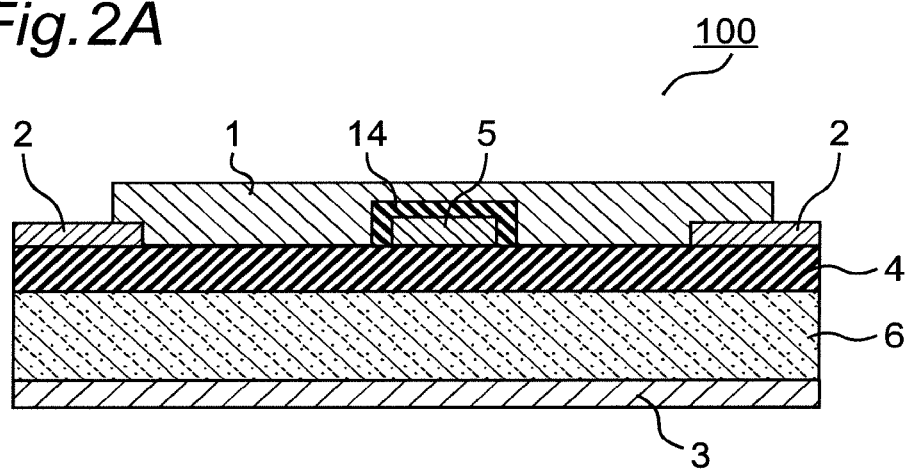
FIG. 2A is a cross-sectional view of the electromagnetic wave detector of FIG. 1.

FIG. 1 is a top view of an electromagnetic wave detector according to a first embodiment of the present invention, generally denoted by 100, and FIG. 2A is a cross-sectional view of the electromagnetic wave detector 100 of FIG. 1 when viewed in a direction IIA-IIA.

The electromagnetic wave detector 100 has a substrate 6 having substantially parallel front and back surfaces. The substrate 6 holds the entire electromagnetic wave detector 100 and is made of a semiconductor material such as Si, and specifically, a high resistance silicon substrate, a substrate with insulating properties enhanced by forming a thermal oxide film, etc. are used. As described later, a silicon substrate doped with an impurity for forming a back-surface electrode 3 may be used. In the case of a substrate having a thermal oxide film, the thermal oxide film may also act as an insulating layer 4.

On the front surface of the substrate 6, the insulating layer (lower insulating layer) 4 is disposed. The insulating layer 4 is made of, for example, silicon oxide ($SiO_2$), silicon nitride (SiN), aluminum oxide, nickel oxide, or boron nitride (BN). Particularly, boron nitride has an atomic arrangement similar to graphene. Therefore, even when coming into contact with graphene, boron nitride does not prevent charge transfer and does not inhibit the performance of graphene in terms of electron mobility etc. and is therefore preferable for a base film of graphene.

On the insulating layer 4, a pair of electrodes 2 is disposed. The electrodes 2 are made of metal such as Au, Ag, Cu, Al, Ni, Cr, and Pd, for example. An adhesion film (not shown) made of Cr or Ti may be formed between the electrodes 2 and the underlying insulating layer 4. The shape of the electrodes 2 is not particularly limited as long as the electrodes have a size and a thickness enabling output of an electric signal.

Figure 4:
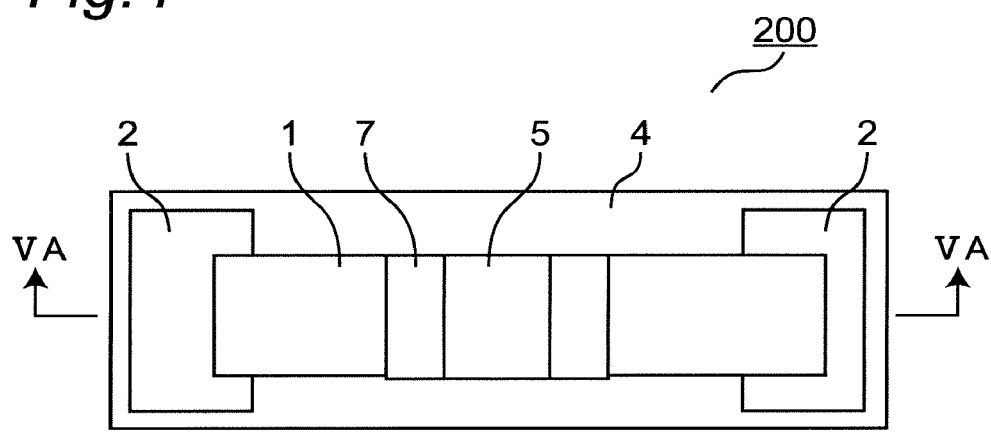
FIG. 4 is a top view of an electromagnetic wave detector according to a second embodiment of the present invention.

A ferroelectric layer 5 is disposed on the insulating layer 4 and is interposed between the two electrodes 2. The film thickness of the ferroelectric layer 5 is preferably a thickness making an electric field applied to a graphene layer 1 as large as possible when the graphene layer 1 is irradiated with an electromagnetic wave. "Bing interposed between the two electrodes 2" means, for example, as shown in the top view of FIG. 2, the presence of the ferroelectric layer 5 between the two electrodes 2 when viewed in a normal line direction of the front surface of the substrate 6 and also includes the case as shown in FIG. 4.

The material of the ferroelectric layer 5 may be a material having a polarization effect (pyroelectric effect) from electromagnetic waves. Representative examples of the material of the ferroelectric layer 5 include $BaTiO_3$ (barium titanate), $LiNbO_3$ (lithium niobate), $LiTaO_3$ (lithium tantalate), $SrTiO_3$ (strontium titanate), PZT (lead titanate zirconate), SBT (strontium tantalate bismuthate), BFO (bismuth ferrite), ZnO (zinc oxide), $HfO_2$ (hafnium oxide), and polyvinylidene fluoride ferroelectrics (such as PVDF, P(VDF-TrFE), and P(VDF-TrFE-CTFE)) that are organic polymers; however, the ferroelectric material is not limited thereto.

Furthermore, different ferroelectric materials may be laminated and mixed. Even a ferroelectric material other than those described above may produce the effects of the present invention as long as a change in polarization occurs in a ferroelectric due to electromagnetic waves. In addition to the ferroelectric materials, the effects of the present invention can be obtained by using a Mott insulator etc. having physical properties changed due to photoinduced phase transition caused by light illumination.

Figure 2B:
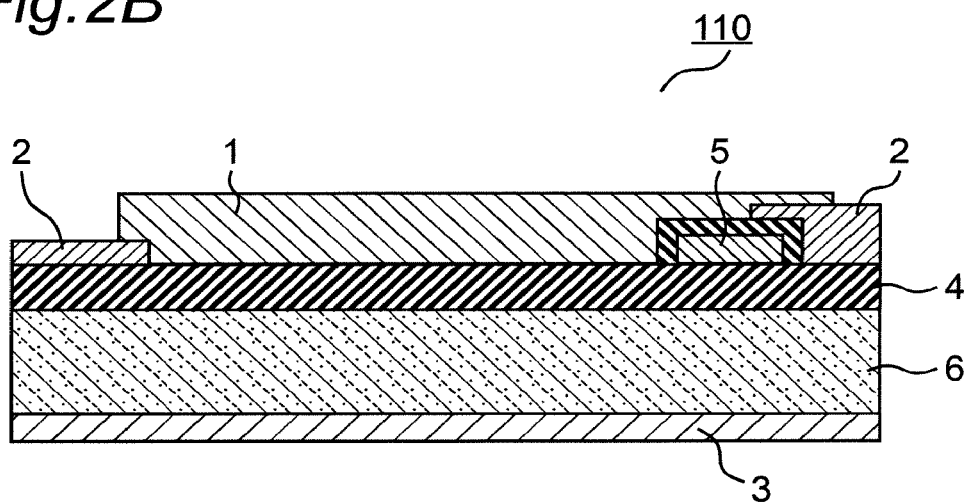
FIG. 2B is a cross-sectional view of another electromagnetic wave detector according to the first embodiment of the present invention.

FIG. 2B is a cross-sectional view of another electromagnetic wave detector according to the first embodiment of the present invention, generally denoted by 210. In FIG. 2B, the same reference numerals as FIG. 2A denote the same or corresponding portions. As shown in FIG. 2B, the ferroelectric layer 5 may be arranged not only under the graphene layer 1 (in the direction toward the front surface of the substrate) as in the electromagnetic wave detector 100 but also under an interface between the electrode 2 and the graphene layer 1 contacting each other. The ferroelectric layer 5 may be arranged not only under the interface between one of the electrodes 2 and the graphene layer 1 as shown in FIG. 2B but also under the interfaces between both of the electrodes 2 and the graphene layer 1 (in the direction toward the front surface of the substrate). The ferroelectric layer 5 may be arranged entirely under the graphene layer 1 or may partially be arranged under the interfaces between the graphene layer 1 and the electrodes 2.

An insulating layer (upper insulating layer) 14 is disposed on the ferroelectric layer 5 so as not to bring the ferroelectric layer 5 in to direct contact with the graphene layer 1. If the ferroelectric layer 5 is in direct contact with the graphene layer 1, electric charge is exchanged between the spontaneous polarization of the ferroelectric layer 5 and the graphene layer 1, which makes an optical response smaller. Additionally, if the ferroelectric layer 5 is in contact with the graphene layer 1, strong hysteresis occurs, which is not preferable for an electromagnetic wave detector. The thickness of the insulating layer 14 is preferably a thickness not causing these effects and making the electric field generated by the pyroelectric effect of the ferroelectric layer 5 and applied to the graphene layer 1 as large as possible.

On the insulating layers 4, 14 and the electrode 2, the graphene layer 1 is disposed and connected to the two electrodes 2. The graphene layer 1 is made up of a single layer or two or more layers of graphene. By increasing the number of layers of graphene, the light absorptivity increases, and the sensitivity of the electromagnetic wave detector 100 becomes higher. Graphene is a monoatomic layer of two-dimensional carbon crystal, and monolayer graphene has an extremely thin thickness of 0.34 nm corresponding to one carbon atom. Graphene has carbon atoms in each chain arranged in a hexagonal shape.

In the case of the graphene layer 1 having a laminated structure of two or more layers of graphene, arbitrary two layers of graphene included in the laminated structure may not be identical in terms of direction of a lattice vector of a hexagonal lattice, i.e., may be deviated in direction. Alternatively, the laminated structure may have completely matched lattice vectors. Particularly, by laminating two or more layers of graphene, a band gap can be formed, and an absorption wavelength selection effect can be provided.

In the case of using nanoribbon-like graphene, the graphene layer 1 may have a graphene nanoribbon alone, or a structure in which multiple graphene nanoribbons are laminated, or a structure in which graphene nanoribbons are periodically arranged on a plane. When graphene nanoribbons are periodically arranged, plasmon resonance occurs in graphene, which has an effect of improving sensitivity of a photodetector. The structure having periodically-arranged graphene nanoribbons is sometimes referred to as graphene metamaterial, which causes the same phenomenon. The graphene layer 1 may be undoped or may be doped into P-type or N-type.

Along with the electromagnetic wave detector 100, an output amplifier circuit using graphene may be disposed next to, or in a lower portion of, the electromagnetic wave detector 100. The output amplification circuit using graphene operates faster than an output amplification circuit using silicon-based semiconductor material, so that high-performance electromagnetic wave detector can be implemented. Additionally, use of graphene in a peripheral circuit such as a reading circuit enables high-speed reading and simplification of a manufacturing process.

To the graphene layer 1, an electric circuit for taking out a change in a photocurrent such as external bias is connected via the electrodes 2. For example, regarding a method of reading an electric signal, if a voltage $V_d$ is applied between the two electrodes 2, a change in the resistance value of the graphene layer 1 caused by electromagnetic waves made incident on the graphene layer 1 causes a change in an amount Id of the current flowing between the electrodes 2. By detecting the change in the amount Id of the current, the magnitude of the electromagnetic wave made incident on the graphene layer 1 can be detected. Alternatively, a circuit applying a constant current may be added between the two electrodes 2 to detect an amount of change in the voltage value. Alternatively, only one of the electrodes 2 may be formed, and this electrode may be used for detecting a change in potential of the graphene layer 1 due to incident electromagnetic waves.

In the case of detecting the photocurrent generated due to electromagnetic waves made incidence on the graphene layer 1 in the electromagnetic wave detector 100, the electromagnetic wave detector 100 operates even if an external bias is applied between the two electrodes 2 of the electromagnetic wave detector 100. It is noted that by applying the external bias, a detection efficiency of generated carriers is increased.

An operation principle of the electromagnetic wave detector 100 according to the first embodiment of the present invention will be described. When an electromagnetic wave is incident on the ferroelectric layer 5 in the electromagnetic wave detector 100, a polarization value changes on a surface of the ferroelectric layer 5 due to the pyroelectric effect. Due to this change, a polarization voltage is applied via the insulating layer 14 to the graphene layer 1. In this case, the polarization voltage serves as a gate voltage to achieve a state in which the gate voltage is equivalently applied. As described above, the graphene layer 1 has an ultimate thin film having the thickness of one atomic layer and has high electron mobility. Therefore, as compared to an ordinary semiconductor, even a slight change in electric field causes a large current change. Consequently, a large differential current can be taken out with respect to incident electromagnetic waves, so that the electromagnetic waves can be detected with high sensitivity. Such an effect is referred to as an optical gate effect or an optical switch.

Figure 3:
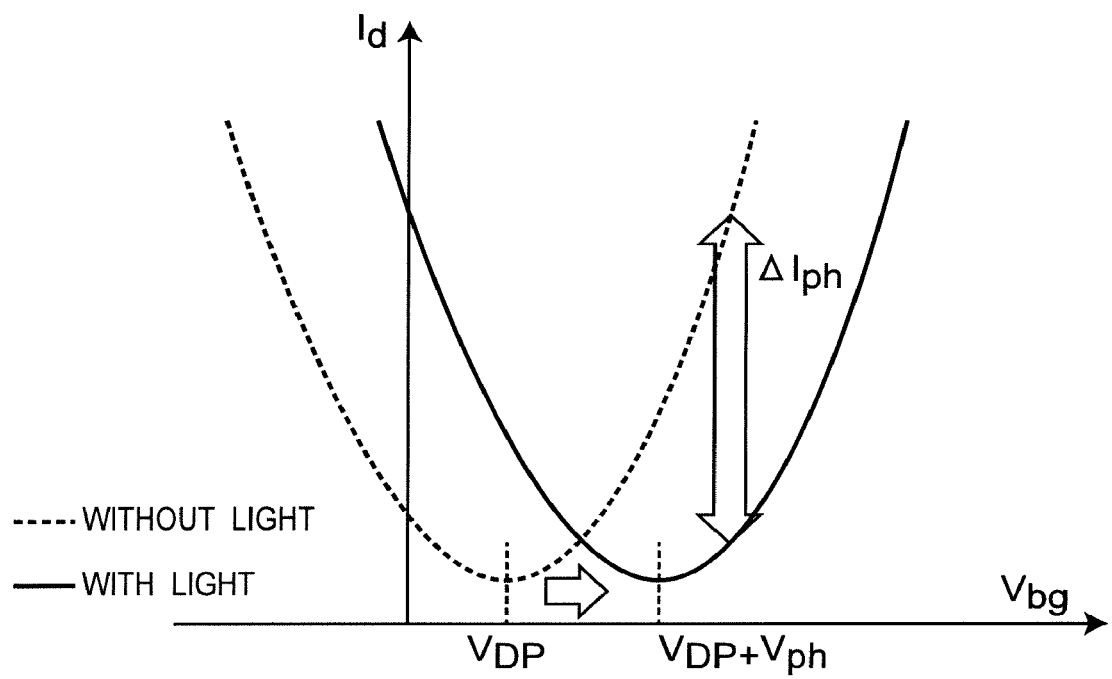
FIG. 3 is a diagram for explaining enhancement of detection sensitivity of an electromagnetic wave detector according to the present invention.

FIG. 3 is a diagram for specifically explaining the optical gate effect. To facilitate understanding of the explanation, description will be made with reference to a structure including the back-surface electrode 3 (a structure of a sixth embodiment, FIG. 11). In FIG. 3, the vertical axis represents a current between a source and a drain, and the horizontal axis represents a back-gate voltage Vbg applied to the back-surface electrode 3. In FIG. 3, a broken line indicates the case without light illumination (dark), and a solid line indicates the case with light illumination (illuminated).

When the back-gate voltage Vbg is changed in the case without light illumination, a bipolar transistor operation in normal graphene is performed. It is assumed that the back-gate voltage Vbg giving a Dirac point is $V_{DP}$. On the other hand, in the case with light illumination, a change in the dielectric polarization occurs in the ferroelectric layer 5 due to the pyroelectric effect. The polarization voltage formed by the change in the dielectric polarization is applied to the graphene layer 1 above the ferroelectric layer 5. In this case, both the back-gate voltage Vbg originally applied from the back electrode 3 and the polarization voltage caused by the change in the dielectric polarization of the ferroelectric layer 5 are applied to the graphene layer 1. The voltage corresponding to this change is represented by $V_{ph}$ in FIG. 3. Therefore, in the presence of light illumination, the current-voltage characteristics indicated by the dotted line in FIG. 3 is achieved, and the Dirac point voltage ($V_{DP}$) is shifted to $V_{DP}+V_{ph}$. Therefore, this shift causes a difference in current, i.e., a differential current ($\Delta I_{ph}$), between the cases without and with light illumination. The incident electromagnetic waves can be detected by this $\Delta I_{ph}$.

If the ferroelectric layer 5 is disposed not only under the graphene layer 1 but under the interface between the electrode 2 and the graphene layer 1 contacting each other as shown in FIG. 2B, the polarization voltage is applied to the interface between the electrode 2 and the graphene layer 1. The graphene layer 1 is generally doped with free electrons in the metal used for the electrode 2. Therefore, a gradient is generated in the energy potential at the interface between the graphene layer 1 and the electrode 2, so that the efficiency of extracting photoelectrically converted electrons becomes higher. By arranging the ferroelectric layer 5 to cover this interface region, the polarization voltage of the ferroelectric layer 5 is applied to the interface. This further improves the efficiency of extracting the photoelectrically converted electrons, resulting in an improvement in the sensitivity.

As already described, the graphene layer 1 is the ultimate thin film having the thickness of one atomic layer and has high electron mobility. Therefore, as compared to an ordinary semiconductor, a slight change in the electric field (the electric field applied to graphene due to Vph) causes a large current change. For example, when calculated from the mobility and the film thickness, a current change amount ($I_{ph}$) relative to the electric field applied to the graphene due to the change ($V_{ph}$) in external voltage is at least several hundred to several thousand times larger as compared to an ordinary semiconductor.

As described above, by using the change in the dielectric polarization caused by light illumination as the polarization voltage, the conversion efficiency can dramatically be increased as compared to the low-efficiency photoelectric conversion (2.3%) of graphene. Such an optical gate effect increases a change of current due to light incidence, rather than directly enhancing a quantum efficiency of a photoelectric conversion material, so that the quantum efficiency equivalently calculated from a differential current due to light incidence can exceed 100%. Therefore, an extremely large effect can be obtained (about several hundred to several thousand times larger) as compared to a conventional sensitivity improvement technique. In addition to this effect, photocurrent is also generated due to the absorption efficiency of 2.3% inherent to graphene.

As shown in FIG. 1, if the ferroelectric layer 5 is disposed between the two electrodes (source and drain electrodes) 2, the applied polarization voltage is different between a region of the graphene layer 1 without the underlying ferroelectric layer 5 and a region of the graphene layer 1 with the underlying ferroelectric layer 5, and therefore, a difference occurs in the Fermi level in each of the regions. In other words, a potential gradient is generated, and a pseudo PNP junction (or NPN junction) is formed. This phenomenon will be described. It is noted that N and P mean semiconductor conductivity types N and P.

In the case of Graphene, the bipolarity thereof is different from the N and P types in semiconductors; however, the Fermi energy can be adjusted by the polarization voltage, so that whether majority carriers are electrons or holes can be selected, and therefore, the N type and the P type can equivalently be achieved. In other words, since a carrier density is different between regions in which a voltage applied to a graphene body is different, a potential gradient is formed between these regions. It is assumed in this description that this potential gradient is an example of a PNP type, for example. Due to the potential gradient of the PNP junction (or NPN junction), the photocurrent extraction efficiency is further improved. In this way, by disposing the ferroelectric layer 5 interposed between the two electrodes (source and drain electrode) 2, a potential gradient can be formed, and the photocurrent extraction efficiency is improved.

Even if the ferroelectric layer 5 is formed over the entire surface rather than a portion between the two electrodes 2, the optical gate effect can be obtained.

A method for manufacturing the electromagnetic wave detector 100 will briefly be described. The method for manufacturing the electromagnetic wave detector 100 includes the following steps 1 to 5.

Step 1: The substrate 6 having substantially parallel and flat front and back surfaces is prepared. The substrate 6 is made of silicon, for example.

Step 2: The insulating layer 4 is formed on the substrate 6. For example, when the substrate 6 is made of silicon, the insulating layer 4 may be made of silicon oxide ($SiO_2$) formed by thermal oxidation. Another type of the insulating layer 4 may be formed by a CVD method or a sputtering method.

Step 3: The ferroelectric layer 5 is formed on the insulating layer 4. In the case that the ferroelectric layer 5 is made of a polymer material, a polymer film is formed by a spin coating method etc. and then processed into a shape operating as a gate by using a photolithography method. In the case of other materials, a film is formed by sputtering, vapor deposition, a MOD coating method, etc., and then patterned by a photolithography method. After forming the ferroelectric layer 5, the insulating layer 14 is formed to cover the ferroelectric layer 5.

Step 4: The electrodes 2 are formed on the insulating layer 4 such that the ferroelectric layer 5 is interposed therebetween. The electrodes 2 are made of Au, Ag, Cu, Al, Ni, or Cr, for example. When the electrodes 2 are formed, an adhesion film (not shown) of Cr or Ti may be formed under the electrodes 2 to improve the adhesion with the underlying insulating layer 4. The electrodes 2 are formed by forming a resist mask opened in a predetermined portion on the insulating layer 4 with photolithography, EB lithography, etc. and then depositing a metal layer of Au etc. by vapor deposition, sputtering, etc.

Step 5: Graphene is formed on the electrodes 2 and the insulating layers 4, 14. Graphene is formed by epitaxial growth. Alternatively, graphene preliminarily formed by a CVD method may be transferred and affixed, or graphene peeled off by mechanical peeling etc. may be transferred and affixed. Subsequently, graphene is coated with a resist mask by photolithography etc. and patterned by etching with oxygen plasma. As a result, unnecessary graphene other than channel portions on the electrodes 2 and between the electrodes 2 is selectively removed to form the graphene layer 1.

For example, in a specific structure of the electromagnetic wave detector 100, the distance between the two electrodes 2 is 50 μm and the length of the electrode 2 is 50 μm when viewed in the cross section of FIG. 2. The electrodes 2 have a multilayer structure of metal, an outermost surface made of gold, and a thickness of 30 nm. A Cr film having a thickness of 10 nm is formed between the electrodes 2 and the insulating layer 4 for improving adhesion (not shown). The insulating layer 4 is made up of a thermal oxide film of silicon (SiO$_2$) and has a thickness of 290 nm. The substrate 6 is made of silicon doped into the P type.

Through steps 1 to 5 described above, the electromagnetic wave detector 100 according to the first embodiment of the present invention is completed. Although the graphene layer 1 is formed on the electrodes 2, a structure having the graphene layer 1 formed in advance before the electrodes 2 formed thereon may be used as described later. If such a structure is used, preferably, a protective film is formed on the graphene layer 1 to prevent a process damage of the graphene layer 1 when the electrodes 2 are formed. With such a protective film, the graphene layer 1 can be protected from external contamination, noise, etc., and the electromagnetic wave detector with higher performance can be obtained.

Second Embodiment

Figure 5A:
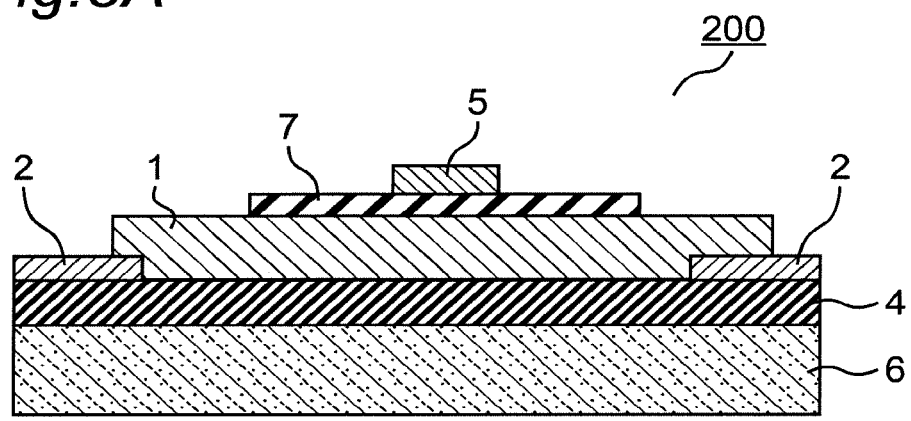
FIG. 5A is a cross-sectional view of the electromagnetic wave detector of FIG. 4.

FIG. 4 is a top view of an electromagnetic wave detector according to a second embodiment of the present invention, generally denoted by 200, and FIG. 5A is a cross-sectional view of the electromagnetic wave detector 200 of FIG. 4 when viewed in a direction VA-VA. In FIGS. 4 and 5A, the same reference numerals as FIGS. 1 and 2 denote the same or corresponding portions.

The electromagnetic wave detector 200 according to the second embodiment is different from the electromagnetic wave detector 100 according to the first embodiment in that the ferroelectric layer 5 is formed above the graphene layer 1 via an insulating layer (upper insulating layer) 7 rather than on the insulating layer (lower insulating layer) 4. The mechanism of the optical gate effect from the ferroelectric layer 5, the photocurrent enhancement effect, etc. are the same as the electromagnetic wave detector 100 of the first embodiment.

In the electromagnetic wave detector 200 according to the second embodiment, since the ferroelectric layer 5 is formed above the graphene layer 1, the intensity of the electromagnetic waves incident on the ferroelectric layer 5 increases, and the optical gate effect increases. Therefore, the electromagnetic wave detector 200 with high electromagnetic-wave detection sensitivity can be obtained.

Figure 5B:
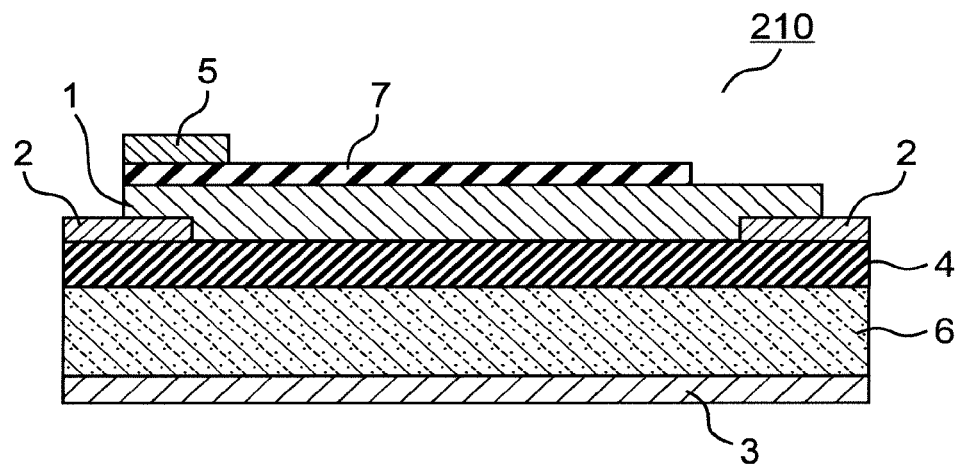
FIG. 5B is a cross-sectional view of another electromagnetic wave detector according to the second embodiment of the present invention.

FIG. 5B is a cross-sectional view of another electromagnetic wave detector according to the second embodiment of the present invention, generally denoted by 210. In FIG. 5B, the same reference numerals as FIG. 5A denote the same or corresponding portions. As shown in FIG. 5B, the ferroelectric layer 5 may be arranged above an interface between the electrode 2 and the graphene layer 1 contacting each other, at a position covering the interface (on the side opposite to the substrate). By arranging the ferroelectric layer 5 above the interface between the graphene layer 1 and the electrode 2, the intensity of the electromagnetic waves incident on the ferroelectric layer 5 increases due to the same principle as that described in the first embodiment, and the optical gate effect further increases, so that the electromagnetic wave detector 210 with high electromagnetic-wave detection sensitivity can be obtained.

As shown in FIG. 5B, the ferroelectric layer 5 may be arranged not only above the interface between one of the electrodes 2 and the graphene layer 1 but also above the interfaces between both of the electrodes 2 and the graphene layer 1. The ferroelectric layer 5 may be disposed entirely above the graphene layer 1 or may partially be disposed above the interfaces between the graphene layer 1 and the electrodes 2.

The manufacturing method is substantially the same as the manufacturing method of the electromagnetic wave detector 100 described above, and after forming the electrode 2, the graphene layer 1 is formed without forming the ferroelectric layer 5. Subsequently, the insulating layer 7 is formed as a protective film on the graphene layer 1 by vapor deposition etc. The thickness of the insulating layer 7 is preferably as thin as possible so that the polarization voltage of the ferroelectric layer 5 is well applied to the graphene layer 1. Subsequently, the ferroelectric layer 5 is formed on the insulating layer 7. This completes the electromagnetic wave detector 200.

Third Embodiment

Figure 6:
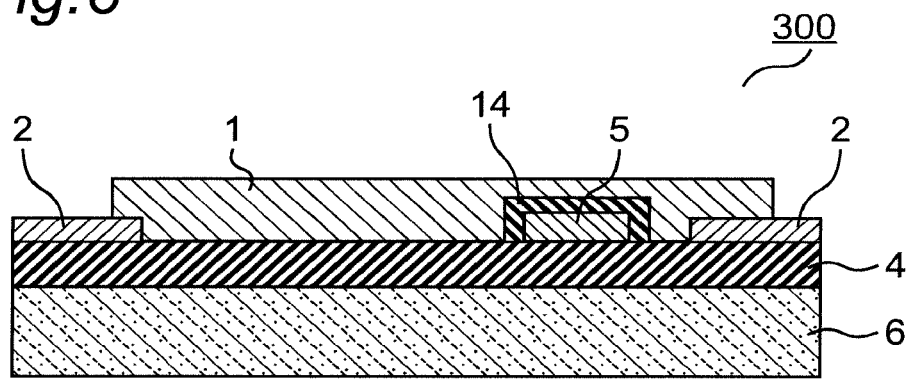
FIG. 6 is a cross-sectional view of an electromagnetic wave detector according to a third embodiment of the present invention.

FIG. 6 is a cross-sectional view of an electromagnetic wave detector according to a third embodiment of the present invention, generally denoted by 300. FIG. 6 is a cross-sectional view in the same direction as the direction IIA-IIA of FIG. 1, and in FIG. 6, the same reference numerals as FIG. 2 denote the same or corresponding portions.

The electromagnetic wave detector 300 according to the third embodiment is different from the electromagnetic wave detector 100 according to the first embodiment in that the ferroelectric layer 5 formed on the insulating layer 4 and the two electrodes (source and drain electrodes) 2 disposed with the ferroelectric layer 5 interposed therebetween have difference distances from the ferroelectric layer 5 to the respective electrodes 2. The other structures are the same.

As described above, since the polarization voltage applied to the graphene layer 1 is different between a region of the graphene layer 1 without the underlying ferroelectric layer 5 and a region of the graphene layer 1 with the underlying ferroelectric layer 5, a pseudo PNP junction is formed, and a potential gradient is formed. Regarding this potential gradient, for example, the structure is symmetric on both sides of the ferroelectric layer 5 in FIG. 2, and therefore, the bias between the two electrodes 2 is zero. In this case, the photocurrents generated in the graphene layer 1 by the incident electromagnetic waves flow in the opposite directions in the same amount through the left and right regions of the ferroelectric layer 5. Therefore, the currents between the two electrodes (source and drain electrodes) are canceled and become zero.

In contrast, in the electromagnetic wave detector 300 according to the third embodiment, the two electrodes 2 with the ferroelectric layer 5 interposed therebetween are located at asymmetric positions (at different distances), which causes a difference in the potential in the graphene layer 1 on both sides of the ferroelectric layer 5. Therefore, the potential gradient of the graphene layer 1 on the left and right sides of the ferroelectric layer 5 can be made asymmetric. The potential gradient becomes asymmetric since a bias voltage applied to the graphene layer 1 differs between the left and right sides of the ferroelectric layer 5. Therefore, the sum of the currents flowing in the graphene layer 1 between the two electrodes 2 is not canceled to zero, so that a photocurrent flows between the two electrodes, which consequently eliminates the need for applying a bias voltage between the two electrodes. The elimination of the need for applying a bias voltage makes it possible to overcome a fundamental disadvantage, i.e., the difficulty of OFF operation, attributable to the physical properties of graphene. As a result, the electromagnetic wave detector 300 having a good S/N ratio can be obtained.

Fourth Embodiment

Figure 7:
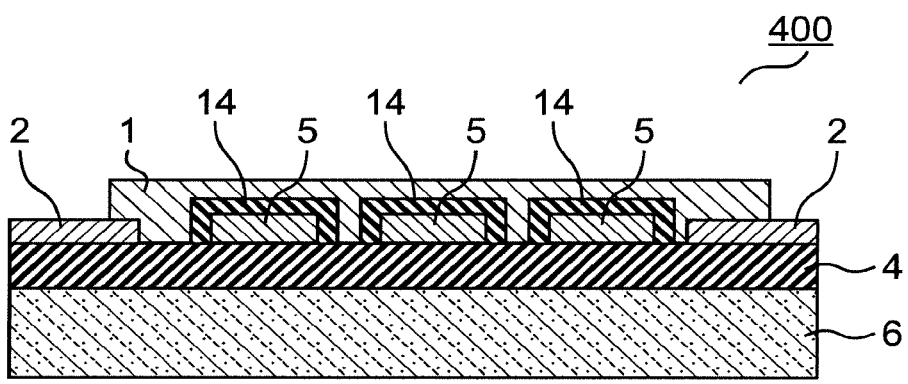
FIG. 7 is a cross-sectional view of an electromagnetic wave detector according to a fourth embodiment of the present invention.

FIG. 7 is a cross-sectional view of an electromagnetic wave detector according to a fourth embodiment of the present invention, generally denoted by 400. FIG. 7 is a cross-sectional view in the same direction as the direction IIA-IIA of FIG. 1, and in FIG. 7, the same reference numerals as FIG. 2 denote the same or corresponding portions.

The electromagnetic wave detector 400 according to the fourth embodiment is different from the electromagnetic wave detector 100 according to the first embodiment in that the ferroelectric layer 5 disposed at the center of the two electrodes 2 in the electromagnetic wave detector 100 is one of three ferroelectric layers disposed in parallel (in the left-right direction of FIG. 7) and interposed between the two electrodes 2. The other structures are the same.

As described above, by providing the ferroelectric layer 5 interposed between the two electrodes 2, an electron density gradient can be formed in the graphene layer 1. Since the electromagnetic wave detector 400 has the three ferroelectric layers 5 between the two electrodes 2, three electron density gradients are formed in series, so that a stepwise electron density gradient is formed. This has the same effect as increasing the bias voltage applied between the two electrodes 2, and the photocurrent extraction efficiency is improved. Since the electron density gradient can be adjusted by appropriately adjusting the interval and number of the ferroelectric layers 5, the optimum bias voltage can be formed in the graphene layer 1.

Figure 8:
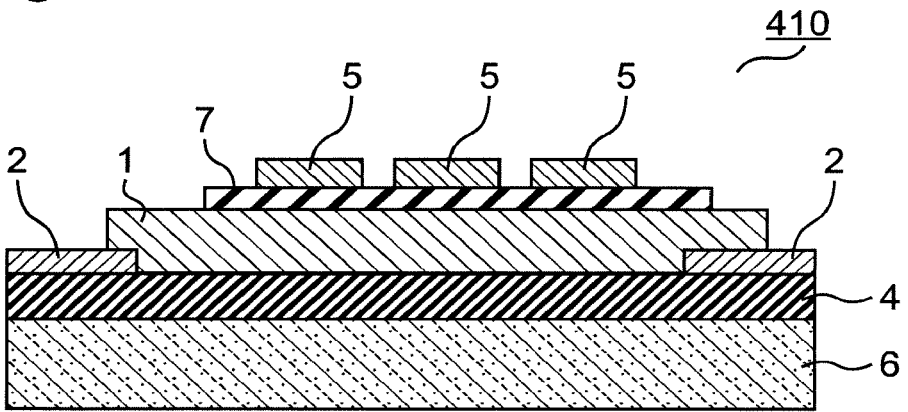
FIG. 8 is a cross-sectional view of another electromagnetic wave detector according to the fourth embodiment of the present invention.

FIG. 8 is a cross-sectional view of another electromagnetic wave detector according to a fourth embodiment of the present invention, generally denoted by 410. FIG. 8 is a cross-sectional view in the same direction as the direction VA-VA of FIG. 4, and in FIG. 8, the same reference numerals as FIG. 4 denote the same or corresponding portions.

The electromagnetic wave detector 410 according to the fourth embodiment is different from the electromagnetic wave detector 200 according to the second embodiment in that the ferroelectric layer 5 disposed at the center of the two electrodes 2 in the electromagnetic wave detector 200 is one of three ferroelectric layers disposed in parallel (in the left-right direction of FIG. 8). The other structures are the same.

Since the electromagnetic wave detector 410 has the three ferroelectric layers 5 disposed between the two electrodes 2, three electron density gradients are formed in series in the graphene layer 1 interposed between the two electrodes 2, so that a stepwise electron density gradient is formed. This increases the bias voltage applied between the two electrodes 2, and the photocurrent extraction efficiency is improved. Since the electron density gradient can be adjusted also in the electromagnetic wave detector 410 by appropriately adjusting the interval and number of the ferroelectric layers 5, the optimum bias voltage can be formed in the graphene layer 1.

Although the number of the ferroelectric layers 5 is three in the electromagnetic wave detectors 400, 410, the present invention is not limited thereto, and the same effect can be obtained as long as the two or more ferroelectric layers 5 are present.

Fifth Embodiment

Figure 9:
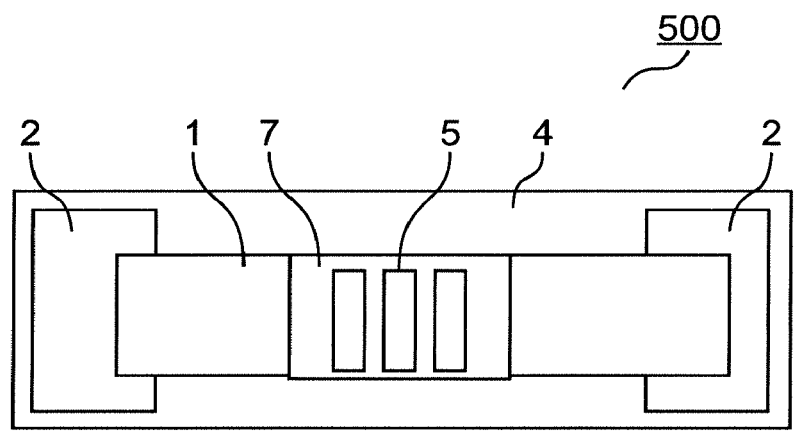
FIG. 9 is a top view of an electromagnetic wave detector according to a fifth embodiment of the present invention.
Figure 10:
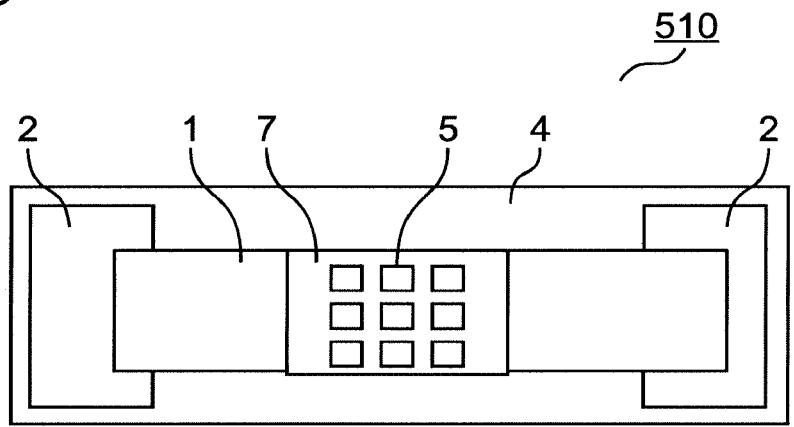
FIG. 10 is a top view of another electromagnetic wave detector according to the fifth embodiment of the present invention.

FIG. 9 is a top view of an electromagnetic wave detector according to a fifth embodiment of the present invention, generally denoted by 500, and FIG. 10 is a top view of another electromagnetic wave detector according to the fifth embodiment of the present invention generally denoted by 510. In FIGS. 9 and 10, the same reference numerals as FIG. 4 denote the same or corresponding portions.

The electromagnetic wave detectors 500, 510 according to the fifth embodiment are different from the electromagnetic wave detector 200 of the second embodiment shown in FIG. 4 in that the electromagnetic wave detectors 500, 510 have the ferroelectric layers 5 periodically arranged in one-dimensional or two-dimensional direction on the insulating layer 7. Although the ferroelectric layers 5 act as an optical gate in the same way as the electromagnetic wave detector 200, since the ferroelectric layers 5 are arranged in a predetermined period, the incident electromagnetic wave can be diffracted. At the same time, a surface wave can be formed by the surface plasmon resonance.

Graphene is known as a material with little loss when propagating the surface plasmon resonance. Therefore, the electromagnetic wave diffracted by the ferroelectric layers 5 or the electromagnetic wave coupled to the front surface can propagate on the front surface of the graphene layer. Therefore, only a specific diffracted or coupled wavelength can be detected by the graphene layer 1.

As shown in FIG. 9, if the ferroelectric layers 5 are periodically arranged in a one-dimensional direction on the insulating layer 7 in a direction from one electrode toward the other electrode (lateral direction in FIG. 9), an electromagnetic wave irradiation surface has an asymmetric structure. For example, in FIG. 9, the diffraction differs depending on the polarization of the incident electromagnetic wave with respect to the lateral direction and the longitudinal direction. As a result, a specific polarized light can be diffracted, or coupled to a graphene surface, by the ferroelectric layers 5. Since only the specific polarized light of the incident electromagnetic wave is coupled to the graphene layer 1 and the ferroelectric layers 5, wavelength-selective detection can be achieved for detecting only the specific polarized light. As described above, the electromagnetic wave detector 510 detecting a predetermined polarized light is implemented with this structure, which enables application to polarization imaging.

As shown in FIG. 10, if the ferroelectric layers 5 are periodically arranged in a two-dimensional direction in a matrix form on the insulating layer 7, and the ferroelectric layers 5 have a highly symmetric shape such as a square and a round shape, only a specific wavelength is coupled to the graphene layer 1 and the ferroelectric layer 5 without depending on the polarization of the incident electromagnetic wave, so that wavelength-selective detection can be achieved for detecting only the specific wavelength. If only the specific wavelength can be detected, this can be used for gas analysis and identification of a harmful substance in infrared and terahertz wavelength regions, for example.

Additionally, if the ferroelectric layers 5 have a highly asymmetric shape such as a rectangle and an ellipse, an optical response depends on the polarization of the incident electromagnetic wave as described above, and therefore, the electromagnetic wave detector 510 detecting a predetermined polarized light is implemented, which enables application to polarization imaging.

By changing the period and size of the ferroelectric layers 5, a detectable polarized light can be selected.

Sixth Embodiment

Figure 11:
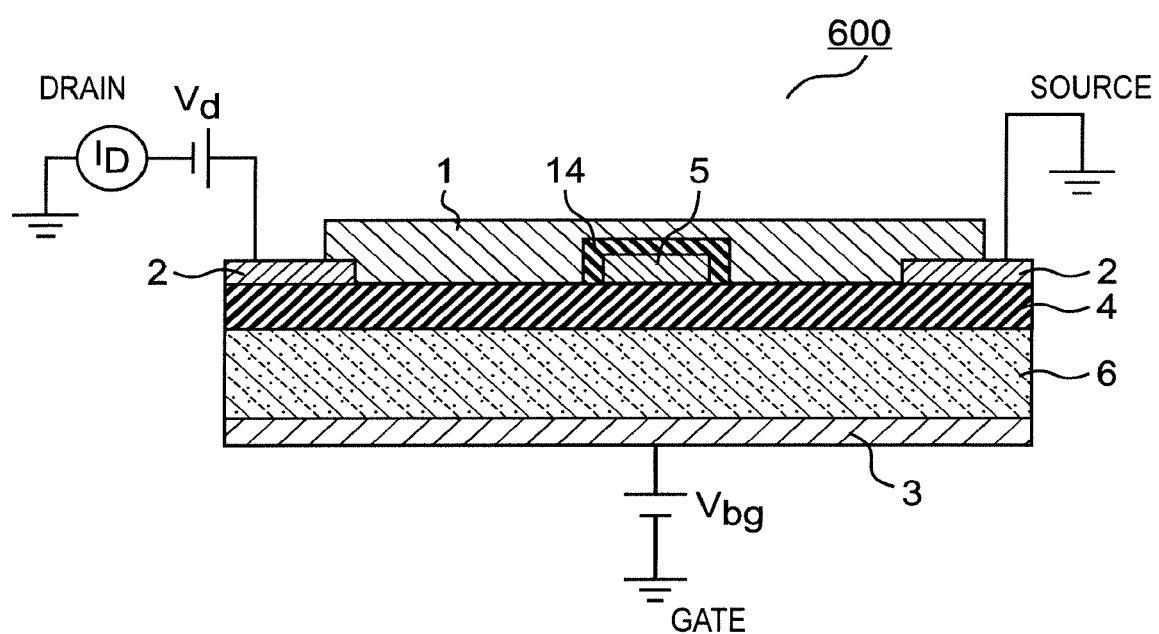
FIG. 11 is a cross-sectional view of an electromagnetic wave detector according to a sixth embodiment of the present invention.

FIG. 11 is a cross-sectional view of an electromagnetic wave detector according to a sixth embodiment of the present invention, generally denoted by 600. The electromagnetic wave detector 600 has the same structure as the electromagnetic wave detector 100, except that the back-surface electrode 3 is disposed on the back surface of the substrate 6. The back-surface electrode 3 is composed of a metal electrode formed on the backside of the substrate 6, for example, and is made of the same material as the electrode 2, for example. The back-surface electrode 3 may be formed by implanting impurities on the back side of the substrate 6. The back-surface electrode may be disposed on the back surface of the insulating layer 4 instead of the substrate 6. The back-surface electrode 3 is also referred to a back-gate electrode.

The electromagnetic wave detector 600 has the back electrode 3 of the substrate 6 used as a gate electrode and combined with the two electrodes (source and drain electrodes) 2 to form a transistor structure to extract an electric signal. In this case, by controlling a back-gate voltage applied to the back-surface electrode 3 of the substrate 6, an OFF current can be made zero.

Figure 12:
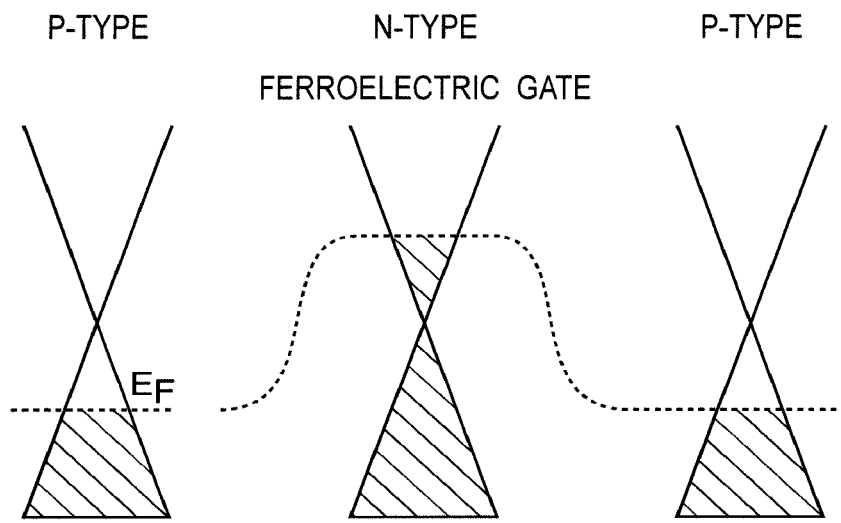
FIG. 12 is a diagram for explaining the operation principle of the electromagnetic wave detector according to the sixth embodiment of the present invention.
Figure 13:
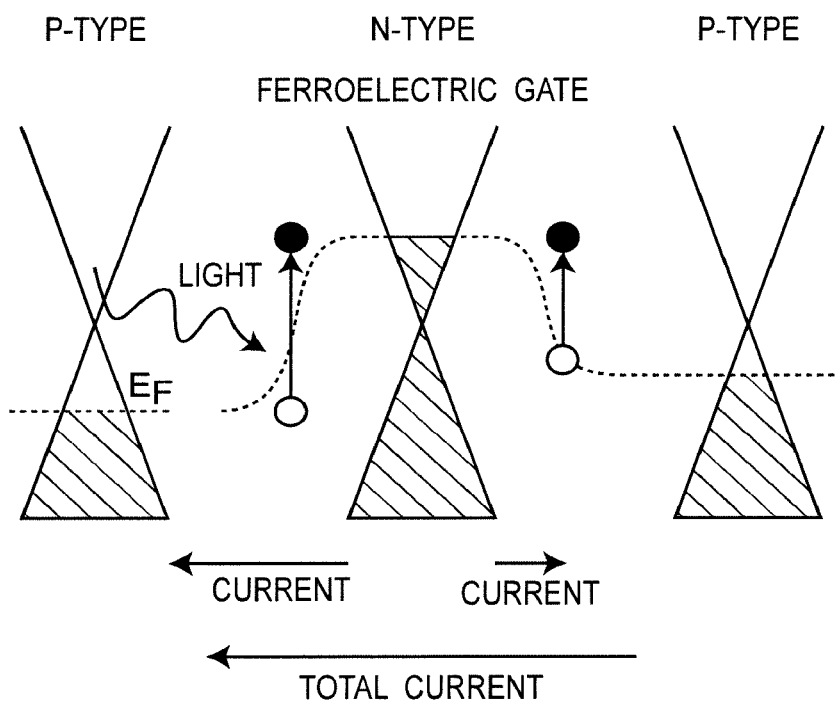
FIG. 13 is a diagram for explaining the operation principle of the electromagnetic wave detector according to the sixth embodiment of the present invention.

The principle of making the OFF current zero will be described. The electronic density of states of the graphene layer 1 is controlled by the back-gate voltage applied to the back-surface electrode 3. Specifically, when the back-gate voltage is minus and plus, the graphene layer 1 becomes P-type and N-type. Due to the same principle, the graphene layer 1 becomes P-type or N-type depending on a polarization voltage generated by a change in the polarization of the ferroelectric layer 5. Therefore, a potential gradient is generated between the left and right sides of the graphene layers 1 and an electric field is applied, so that currents flow in opposite directions from the ferroelectric layer 5 toward the electrodes 2 on both sides. It the ferroelectric layer 5 is completely symmetrical on both sides, the left and right currents cancel each other and become zero. This state is shown in FIG. 12. In this case, the current can be made zero when light illumination does not exist. Therefore, an OFF state can be achieved, and a dark current considered as a fundamental disadvantage of a graphene photodetector can be made zero, so that a photodetector having a high SN ratio can be implemented.

In the state shown in FIG. 12, the voltage applied to the graphene layer 1 is different on the ferroelectric layer 5 and on both sides thereof, a pseudo PNP junction is formed in the graphene layer 1. In FIG. 12, it is assumed that the region above the ferroelectric layer 5 is N-type while the periphery thereof is P-type. Since The front surface polarization of the ferroelectric layer 5 becomes positive or negative depending on a material and a manufacturing method, a material and a method suitable for the design may be used as appropriate.

Since the Fermi level of graphene can then be adjusted by adjusting the back-gate voltage of the back-surface electrode 3, an amount of the current can be made asymmetric in the graphene layers 1 on the left and right sides of the ferroelectric layer 5. As a result, the currents do not cancel out each other between the right and left sides, so that the photocurrent can be extracted with high efficiency.

The amount of the current in the graphene layer 1 may be adjusted by the back-gate voltage or may be adjusted by setting the ferroelectric layer 5 at an asymmetric position, instead of the center of the two electrodes 2, as already described. The back-gate voltage and the asymmetry property of the position of the ferroelectric layer 5 may be combined for making the adjustment. In this case, a larger potential gradient can be formed as compared to making the adjustment with either one, and the photocurrent extraction efficiency increases.

As described above, by applying the back-gate voltage to the back-surface electrode 3 in the electromagnetic wave detector 600 according to the sixth embodiment, a current flowing through a graphene transistor can be adjusted to zero when no light is incident. Therefore, the OFF state difficult to achieve in an ordinary graphene transistor can be achieved.

The electromagnetic wave detectors according to the other embodiments can also be increased in the photocurrent extraction efficiency by disposed the back-surface electrode 3.

Seventh Embodiment

Figure 14:
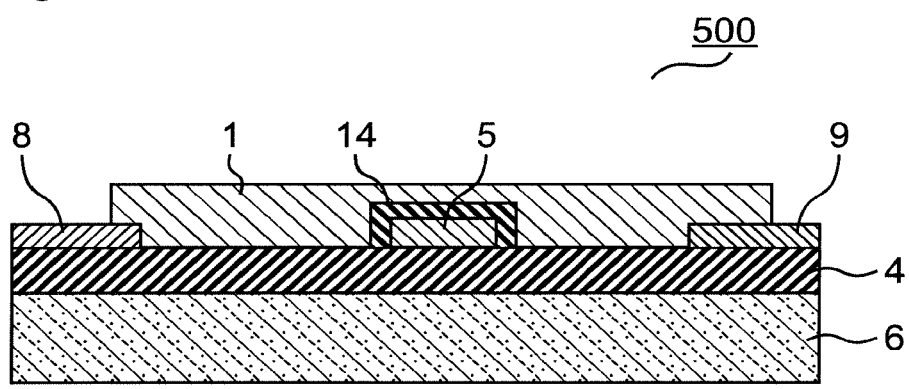
FIG. 14 is a cross-sectional view of an electromagnetic wave detector according to a seventh embodiment of the present invention.

FIG. 14 is a cross-sectional view of an electromagnetic wave detector according to a seventh embodiment of the present invention, generally denoted by 700. FIG. 14 is cross-sectional view in the same direction as the direction IIA-IIA of FIG. 1, and in FIG. 14, the same reference numerals as FIG. 2 denote the same or corresponding portions.

The electromagnetic wave detector 700 according to the seventh embodiment is different from the electromagnetic wave detector 100 according to the first embodiment shown in FIG. 2 in that the two electrodes are formed of an electrode 8 (e.g., a source electrode) and an electrode 9 (e.g., a drain electrode) made of respective different metals.

Graphene has a Fermi level moved, or a contact resistance different, depending on a kind of metal brought into contact therewith. Therefore, if the electrodes 8, 9 are made of different metals, an energy gap of the graphene layer 1 becomes different between the electrode 8 and the electrode 9 (the source electrode and the drain electrode). As a result, when irradiated with an electromagnetic wave, the photocurrent between the electrode 8 and the electrode 9 is increased by generated carriers, so that the sensitivity can be improved. Although the planar shape of the electrodes 8, 9 may be a rectangle as shown in FIG. 14, the present invention is not limited thereto.

The efficiency of detection of only a specific wavelength can be increased by shaping the electrodes into a bow-tie antenna shape, or reducing the distance between the electrodes, to cause the antenna effect or the plasmon resonance between the electrodes.

Eighth Embodiment

In an electromagnetic wave detector (not shown) according to an eighth embodiment of the present invention, a two-dimensional material such as transition metal di-chalcogenide, black phosphorus, silicene, and germanene is used instead of the graphene layer 1 of the electromagnetic wave detector 100 according to the first embodiment. The other structures are the same as the electromagnetic wave detector 100.

Alternatively, graphene nanoribbon processed into a strip shape having a width of about 10 nm to 100 nm may be used for the graphene layer 1. In this case, since plasmon resonance of graphene itself occurs, absorption increases at a wavelength of about 10 µm. Therefore, the sensitivity can be enhanced. Additionally, since only the electric field perpendicular to the longitudinal direction of the nanoribbon can selectively be absorbed, polarization detection can be performed. Therefore, a polarization image sensor detecting polarized light can be implemented.

The two-dimensional material is a generic term for these materials having a structure similar to graphene with atoms arrangeable in a single layer state in a two-dimensional plane. Among others, the typical two-dimensional materials such as transition metal di-chalcogenide and black phosphorus have the same atomic layer structure as graphene. Specifically, the materials are composed of transition metal di-chalcogenide of $MoS_2$, $WS_2$, $WSe_2$ etc. and black phosphorus. Out of these materials, the same materials or different materials may be laminated to each other and used as a structure. Alternatively, bonding of perovskite and graphene, or bonding of different two-dimensional materials may be used.

These two-dimensional materials such as transition metal di-chalcogenide materials and black phosphor have a predetermined band gap. Therefore, the off current is substantially zero, so that the noise of the electromagnetic wave detector becomes small, and the electromagnetic wave detector can be improved in performance.

The magnitude of the band gap can be adjusted by the number of laminated layers of the two-dimensional material such as a transition metal di-chalcogenide and black phosphorus. Therefore, a wavelength of electromagnetic waves to be detected can be selected with the number of layers. For example, $MoS_2$, $WS_2$, etc. have a band gap corresponding to the visible light wavelength. Black phosphorus has a band gap corresponding to the mid-infrared region. Therefore, a wavelength selective type electromagnetic wave detector can be obtained for detecting only electromagnetic waves of a specific wavelength.

Since it is not necessary to control the band gap depending on a composition of a semiconductor material as in conventional semiconductor detectors, manufacturing steps are facilitated. Additionally, since it is not necessary to use an optical filter which is a typical wavelength selection method, the number of optical components can be reduced, and a loss of incident light due to passing through the filter can also be reduced.

When the two-dimensional material such as transition metal di-chalcogenide and black phosphorus is used, the band gap can be adjusted by using a laminated structure composed of multiple layers. By controlling the lamination direction, polarization dependency can be obtained. Therefore, an electromagnetic wave detector can be implemented for selectively detecting only specific polarized light.

Furthermore, by combining two or more different materials out of the two-dimensional materials such as transition metal di-chalcogenide and black phosphorus or combining a two-dimensional material such as transition metal di-chalcogenide and black phosphorus with graphene to achieve hetero junction, the same effect as the quantum well effect or the tunneling effect in the conventional semiconductor materials can be achieved between different materials. As a result, noise can be reduced, and recombination can be reduced, so that the electromagnetic wave detector can be increased in sensitivity. Particularly, in the infrared wavelength region where thermal noise becomes dominant, reduction of thermal noise using the tunnel effect has a large effect. This also enables normal temperature operation.

Ninth Embodiment

Figure 15:
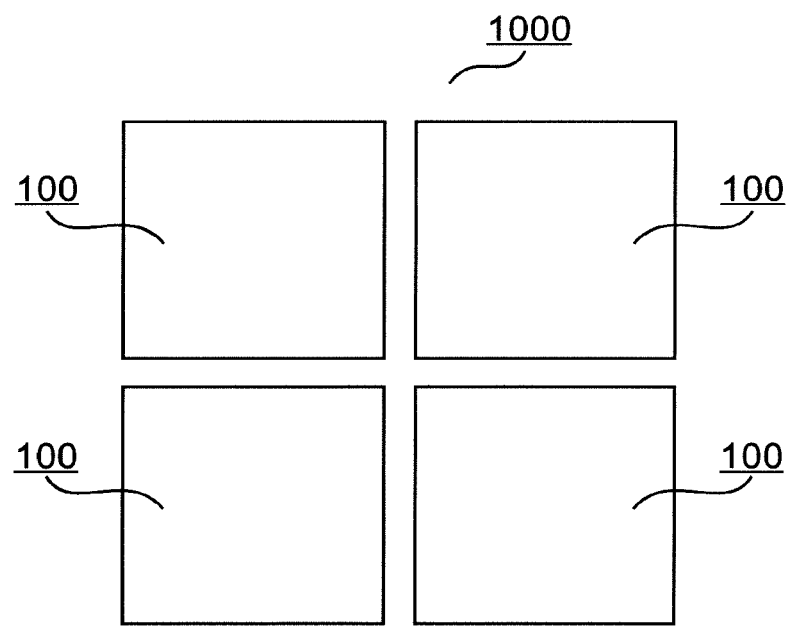
FIG. 15 is a top view of an electromagnetic wave detector array according to a ninth embodiment of the present invention.

FIG. 15 is a top view of an electromagnetic wave detector array according to a ninth embodiment of the present invention, generally denoted by 1000. Although the electromagnetic wave detector array 1000 of FIG. 15 has the electromagnetic wave detectors 100 according to the first embodiment arranged in a 2×2 matrix form, the number of the arranged electromagnetic wave detectors 100 is not limited thereto. Although the detectors are two-dimensionally arrayed in a predetermined periodic arrangement in FIG. 15, the detectors may one-dimensionally be arranged in a predetermined periodic arrangement. Alternatively, the detectors may be arranged at different intervals instead of periodically.

As described above, the electromagnetic wave detector array 1000 using the graphene layer 1 can detect electromagnetic waves in a very wide wavelength range from ultraviolet light to microwaves. Particularly, the arrayed detectors can be used an image sensor. For example, when applied to an in-vehicle sensor, the electromagnetic wave detector array 1000 can be used as a visible light image camera in the daytime and as an infrared camera in the nighttime, which eliminates the need for using different cameras depending on a detection wavelength. The optical system must be switched for each wavelength, and suitable combinations are respectively used.

A reading circuit reading electric signals obtained from the respective electromagnetic wave detectors 100 and a matrix selection circuit are preferably arranged outside the electromagnetic wave detector array 1000.

Tenth Embodiment

Figure 16:
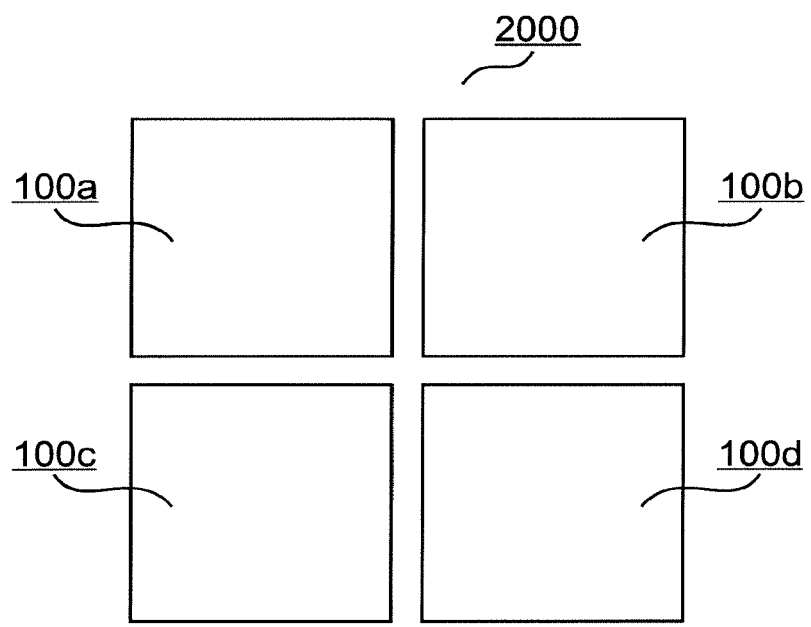
FIG. 16 is a top view of an electromagnetic wave detector array according to a tenth embodiment of the present invention.

FIG. 16 is a top view of an electromagnetic wave detector array according to a tenth embodiment of the present invention, generally denoted by 2000. In FIG. 16, electromagnetic wave detectors 100a, 100b, 100c, 100d of types different from each other are arranged in a 2×2 matrix form. The number of the arranged electromagnetic wave detectors is not limited thereto. Although the detectors are two-dimensionally arrayed in a predetermined periodic arrangement in FIG. 16, the detectors may one-dimensionally be arranged in a predetermined periodic arrangement. Alternatively, the detectors may be arranged at different intervals instead of periodically.

In the electromagnetic wave detector array 2000 according to the tenth embodiment, the different types of the electromagnetic wave detectors described in the first to eighth embodiments are arranged in a one-dimensional or two-dimensional array so that a function of an image sensor can be provided.

In the electromagnetic wave detector array 2000 shown in FIG. 16, for example, the electromagnetic wave detectors 100a, 100b, 100c, 100d may be formed of electromagnetic wave detectors having respective different detection wavelengths. Specifically, the electromagnetic wave detectors having detection wavelength selectivity described in the first to eighth embodiments are arranged in an array. This enables the electromagnetic wave detector array to detect electromagnetic waves of at least two or more different wavelengths.

By arranging the electromagnetic wave detectors having different detection wavelengths in an array as described above, a colorized (wavelength-discriminated) image can be obtained even in the wavelength regions of ultraviolet light, infrared light, terahertz waves, and radio waves as in an image sensor used in the visible light region.

Regarding an application other than the image sensor, even a small number of pixels can be used as a sensor for detecting a position of an object. With the structure of the electromagnetic wave detector array 2000, an image sensor detecting the intensity of electromagnetic waves at multiple wavelengths is obtained. As a result, electromagnetic waves can be detected at multiple wavelengths to obtain a color image without using a color filter conventionally required for a CMOS sensor etc.

Furthermore, a polarization discrimination image sensor can be formed by arraying electromagnetic wave detectors detecting different polarized lights. For example, polarization imaging can be performed by arranging multiple detectors in units of four pixels detecting respective polarization angles set to 0°, 90°, 45°, and 135°. An image sensor capable of polarization discrimination enables, for example, discrimination between artifacts and natural objects, material identification, identification of same-temperature objects in the infrared wavelength region, identification of boundaries between objects, and improvement in equivalent resolution.

EXPLANATIONS OF LETTERS OR NUMERALS

1 graphene layer; 2 electrode; 3 back-surface electrode; 4 insulating layer; 5 ferroelectric layer; 6 substrate; 7 insulating layer; 8 electrode; 9 electrode; 14 insulating layer; 100 electromagnetic wave detector; and 1000, 2000 electromagnetic wave detector array.

The invention claimed is:
1. An electromagnetic wave detector comprising:
a substrate having a front surface and a back surface;
a lower insulating layer disposed on the front surface of the substrate;
a ferroelectric layer, and a pair of electrodes oppositely arranged with the ferroelectric layer interposed therebetween, disposed on the lower insulating layer;
an upper insulating layer disposed on the ferroelectric layer; and
a two-dimensional material layer disposed on the lower insulating layer and the upper insulating layer to connect the two electrodes,
the two-dimensional material layer having a surface serving as an electromagnetic wave incident surface on the side opposite to the lower insulating layer,
the electromagnetic wave detector photoelectrically converting and detecting an electromagnetic wave incident on the two-dimensional material layer,
wherein the ferroelectric layer is changed in polarization value by the electromagnetic wave so that a voltage is applied to the two-dimensional material layer, and
wherein the upper insulating layer is disposed on the ferroelectric layer so that the ferroelectric layer is not directly contacted to the two-dimensional material layer.

2. An electromagnetic wave detector comprising:
a substrate having a front surface and a back surface;
a lower insulating layer disposed on the front surface of the substrate;
a two-dimensional material layer disposed on the lower insulating layer; and
a ferroelectric layer disposed via an upper insulating layer above the two-dimensional material layer and a pair of electrodes oppositely arranged with the ferroelectric layer interposed therebetween,
the two-dimensional material layer having a surface serving as an electromagnetic wave incident surface on the side opposite to the lower insulating layer,
the electromagnetic wave detector photoelectrically converting and detecting an electromagnetic wave incident on the two-dimensional material layer, wherein the ferroelectric layer is changed in polarization value by the electromagnetic wave so that a voltage is applied to the two-dimensional material layer through the upper insulating layer.

3. The electromagnetic wave detector according to claim 1, wherein the ferroelectric layer is disposed under an interface between the two-dimensional material layer and the electrode contacting each other.

4. The electromagnetic wave detector according to claim 1, wherein the ferroelectric layer is not disposed under an interface between the two-dimensional material layer and the electrode contacting each other.

5. The electromagnetic wave detector according to claim 2, wherein the ferroelectric layer is disposed above an interface between the two-dimensional material layer and the electrode contacting each other so as to cover the interface.

6. The electromagnetic wave detector according to claim 2, wherein the ferroelectric layer is disposed above an interface between the two-dimensional material layer and the electrode contacting each other so as not to cover the interface.

7. The electromagnetic wave detector according to claim 1, wherein the one ferroelectric layer is disposed between the two electrodes, and wherein distances from the ferroelectric layer to the two electrodes are equal.

8. The electromagnetic wave detector according to claim 1, wherein the one ferroelectric layer is disposed between the two electrodes, and wherein distances from the ferroelectric layer to the two electrodes are different from each other.

9. The electromagnetic wave detector according to claim 1, wherein a plurality of ferroelectric layers is disposed between the two electrodes.

10. The electromagnetic wave detector according to claim 1, wherein a plurality of ferroelectric layers is arranged in a one-dimensional direction or a two-dimensional direction between the two electrodes.

11. The electromagnetic wave detector according to claim 1, wherein the ferroelectric layer is made of a material acquired by laminating or mixing different ferroelectric materials.

12. The electromagnetic wave detector according to claim 1, wherein the two-dimensional material layer has a multi-layer structure of two or more layers.

13. The electromagnetic wave detector according to claim 1, wherein the two-dimensional material layer is made of a two-dimensional material selected from the group consisting of: graphene, nanoribbon, transition metal di-chalcogenide, black phosphorus, silicene, and germanene, or made of a laminate structure acquired by laminating at least two of the two-dimensional materials.

14. The electromagnetic wave detector according to claim 1, wherein the two electrodes are made of metals different from each other.

15. The electromagnetic wave detector according to claim 1, wherein a back-surface electrode is disposed on the back surface of the substrate or on a back surface of the lower insulating layer.

16. An electromagnetic wave detector array comprising: the electromagnetic wave detector according to claim 1 as a plurality of electromagnetic wave detectors arranged in an array in a one-dimensional direction or a two-dimensional direction.

17. The electromagnetic wave detector array according to claim 16, wherein the plurality of electromagnetic wave detectors is different from each other.

\* \* \* \* \*